United States Patent
Pfister et al.

(10) Patent No.: US 6,888,720 B2
(45) Date of Patent: May 3, 2005

(54) DISTRIBUTED GRAPHITIC FOAM HEAT EXCHANGER SYSTEM

(75) Inventors: Dennis M. Pfister, San Luis Obispo, CA (US); Charles M. Byrd, Rensselaer, NY (US); Howard L. Davidson, San Carlos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 134 days.

(21) Appl. No.: 10/174,836

(22) Filed: Jun. 18, 2002

(65) Prior Publication Data

US 2003/0230401 A1 Dec. 18, 2003

(51) Int. Cl.$^7$ .................................................. H05K 7/20
(52) U.S. Cl. ...................... 361/689; 361/690; 361/691; 361/694; 361/698; 361/699; 361/719; 361/721; 174/16.1; 174/16.3; 165/80.3; 165/80.4; 165/104.33
(58) Field of Search ............................... 361/676–678, 361/689–695, 719–721; 257/706, 714, 722; 174/16.1, 16.3; 165/80.3, 80.4, 104.33, 122

(56) References Cited

U.S. PATENT DOCUMENTS

| 5,297,005 | A | * | 3/1994 | Gourdine ................... 361/697 |
| 5,509,468 | A | * | 4/1996 | Lopez ......................... 165/144 |
| 5,761,037 | A | * | 6/1998 | Anderson et al. ........... 361/700 |
| 5,914,856 | A | * | 6/1999 | Morton et al. .............. 361/690 |
| 5,961,814 | A |   | 10/1999 | Kearns |
| 6,033,506 | A |   | 3/2000 | Klett |
| 6,037,032 | A |   | 3/2000 | Klett et al. |
| 6,388,882 | B1 | * | 5/2002 | Hoover et al. .............. 361/704 |
| 6,424,531 | B1 | * | 7/2002 | Bhatti et al. ................ 361/704 |
| 6,603,662 | B1 | * | 8/2003 | Ganrot ........................ 361/698 |
| 6,650,538 | B1 | * | 11/2003 | Chu et al. ................... 361/688 |
| 2002/0108743 | A1 | * | 8/2002 | Wirtz .......................... 165/185 |

FOREIGN PATENT DOCUMENTS

EP              559092 A1 * 9/1993    ......... H01L/23/373

OTHER PUBLICATIONS

Gou, et al., "Forced Convection in a Channel Filled with High Thermal Conductivity Carbon Foams" (date unknown).
Klett, et al., "Graphitic Foam Thermal Management Materials for Electronic Packaging," Society of Automotive Engineers, Inc., 2000.
Klett, et al., "Thermal Management Solutions Utilizing High Thermal Conductivity Graphite Foams" (date unknown).

* cited by examiner

*Primary Examiner*—Boris Chérvinsky
(74) *Attorney, Agent, or Firm*—Gunnison, McKay & Hodgson, L.L.P.; Philip J. McKay

(57) ABSTRACT

A system for cooling at least two electronic components comprises a plurality of graphitic foam products which are each thermally coupled to a corresponding component, a plurality of housings which are each mounted over a corresponding foam product and which each comprise an inlet and an outlet, a source of cooling fluid, and a conduit which is connected between the fluid source and each inlet. In operation, fluid is communicated from the fluid source to each housing through the conduit to thereby cool the components.

22 Claims, 4 Drawing Sheets

DISTRIBUTED GRAPHITIC FOAM HEAT EXCHANGER SYSTEM

BACKGROUND OF THE INVENTION

The present invention is directed to a system for cooling electronic components and the like. More particularly, the invention is directed to such a system which comprises a number of graphitic foam heat exchangers that are each thermally coupled to a corresponding electronic component and a conduit network for communicating a cooling fluid from a fluid source to each graphitic foam heat exchanger.

Existing devices for cooling electronic components include aluminum and copper heat sinks, which are attached to the component and rely on natural or forced convection to remove the heat from the component. Although aluminum and copper have good thermal conductivities in general, the specific thermal conductivity of each of these materials, that is, the thermal conductivity divided by the specific gravity of the material, is only around 50 W/m-K. Therefore, such heat sinks are generally suitable only for relatively low power components which do not generate significant amounts of heat. For higher power electronic components, the above-described heat sinks have been combined with cooling loops through which a cooling fluid is circulated to more effectively remove the heat generated by the component. However, a risk exists that such a device will leak and damage the component.

In recent years graphitic foam products have been developed for use as heat sinks for electronic components. These graphitic foam products have an open microcellular structure which is defined by an interconnected network of highly aligned graphitic ligaments. As a result, they have very low densities yet relatively high thermal conductivities. Consequently, such foams can have specific thermal conductivities of 300 W/m-K or greater, which is significantly larger than many other thermal management materials.

In addition, researchers at the Oak Ridge National Laboratory have developed a highly efficient heat exchanger which employs a graphitic foam product as the heat transfer medium between an electronic component and a cooling fluid. As described in an article by Klett et al. entitled, "Graphitic Foam Thermal Management Materials for Electronic Packaging" (Copyright© 2000 Society of Automotive Engineers, Inc.), this heat exchanger comprises a graphite foam block which is enclosed in an aluminum housing that forms a substrate for the electronic component. In operation, cool air is forced through the housing and the foam block to remove the heat generated by the component.

Many devices, such as computer workstations and servers, comprise a number of electronic components which each require cooling. However, each of the above-described heat exchangers is typically capable of cooling only a single component. Moreover, although a system of multiple such heat exchangers could be provided to cool all of the components of a single device, such a system would likely require a corresponding number of fluid sources. The existence of multiple fluid sources in a heat exchanger system would undoubtedly make the system both complicated and expensive. Therefore, a need exists for a simple heat exchanger system which is capable of cooling a number of electronic components in a single device.

SUMMARY OF THE INVENTION

In accordance with the present invention, a system for cooling at least two electronic components is provided which comprises a plurality of graphitic foam products, each of which is thermally coupled to a corresponding component, a plurality of housings, each of which is mounted over a corresponding foam product and comprises an inlet and an outlet, a source of cooling fluid, and a conduit which is connected between the fluid source and each inlet. Cooling fluid from a single fluid source may therefore be communicated to each housing through the conduit to thereby cool all of the components. Consequently, a separate fluid source is not required to cool each component.

In one embodiment of the invention, the cooling fluid comprises air and the fluid source comprises an air compressor. In addition, the outlet of each housing is open to the environment. As the air passes through each housing, it will absorb the heat which is conducted through the graphitic foam product and reject this heat into the environment. The system of the present invention thus provides a simple and efficient mechanism for cooling multiple electronic components using air as the cooling fluid.

In yet another embodiment of the invention, the conduit comprises a first portion which is connected to the fluid source and a second portion which is connected to each inlet. Furthermore, the first portion is preferably releasably connected to the second portion with a conventional fluid coupling. Consequently, the first portion may be readily disconnected from the second portion to permit the fluid source to be removed and serviced or replaced.

In still another embodiment of the invention, at least one first electronic component is mounted on a first base which is movably supported on a frame, and the fluid source is mounted on the frame. In addition, the conduit comprises a first portion which is connected to the fluid source and fixed relative to the frame and a second portion which is connected to the housing of the first component and fixed relative to the first base. Furthermore, the system also comprises a first disconnectable coupler for connecting the first portion to the second portion. In this manner, the first portion may be disconnected from the second portion and the base removed from the frame in the event the first component needs to be serviced or replaced.

These and other objects and advantages of the present invention will be made apparent from the following detailed description, with reference to the accompanying drawings. In the drawings, the same reference numbers are used to denote similar elements in the various embodiments.

DETAILED DESCRIPTION OF THE PREFERRED EMBODIMENTS

The distributed graphitic foam heat exchanger system of the present invention may be used to cool a variety of electronic components which during operation generate deleterious heat. The distributed nature of the invention makes it especially useful in cooling a device which comprises a number of such components. These components may be mounted either adjacent each other or in separate portions of the device. For purposes of simplicity, the present invention will be described in conjunction with a computer server which comprises a number of circuit components, such as processors, that are mounted on one or more circuit boards.

Figure 1:
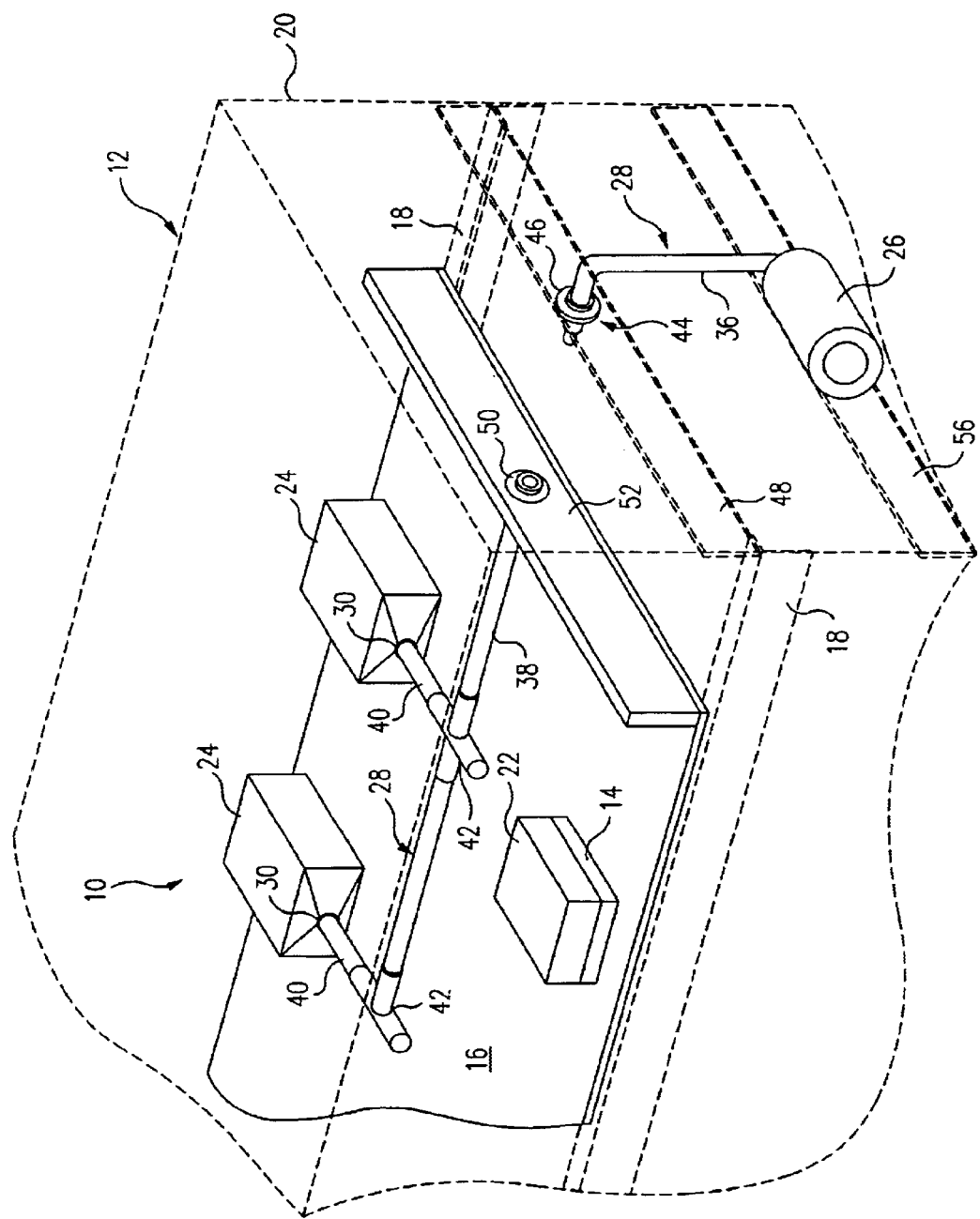
FIG. 1 is a perspective view of the distributed graphitic foam heat exchanger system of the present invention shown installed in an exemplary computer server.

Referring to FIG. 1, the distributed graphitic foam heat exchanger system of the present invention, which is indicated generally by reference number 10, is shown installed in an exemplary computer server 12, portions of which are shown in phantom for purposes of clarity. The server 12 includes a plurality of circuit components 14 which are mounted on one or more bases or circuit boards 16, only one of which is shown. Each circuit board 16 is slidably supported on a rack which comprises a pair of rails 18 that are connected to a support frame or housing 20 of the server 12.

Figure 2:
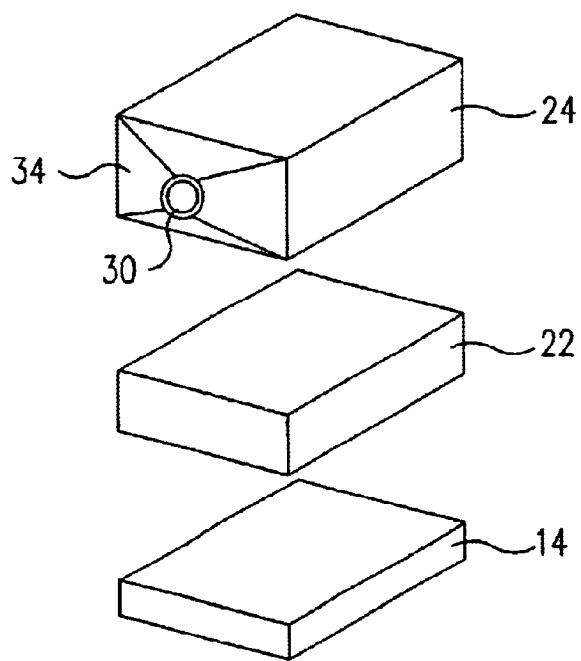
FIG. 2 is an exploded view of a portion of the invention depicted in FIG. 1.
Figure 3:
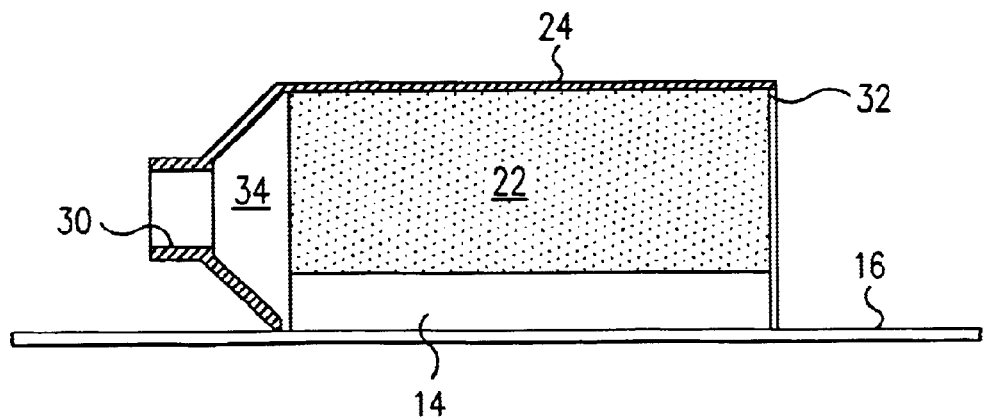
FIG. 3 is a cross section view of the portion of the invention shown in FIG. 2.

Referring also to FIGS. 2 and 3, the distributed graphitic foam heat exchanger system 10 comprises a plurality of graphitic foam products 22, each of which is thermally coupled to a corresponding circuit component 14 with, for example, a suitable thermally conductive adhesive. Each product 22 is enclosed at least partially by a housing 24, which may be connected to either the product, the circuit component 14 or the circuit board 16 by conventional means. For purposes of clarity, one circuit component 14 in FIG. 1 is depicted without its associated housing 24. The distributed graphitic foam heat exchanger system 10 also comprises a fluid source 26 and a conduit network 28 for fluidly connecting the fluid source to each of the housings 24.

The graphitic foam product 22 ideally comprises a solid mesophase pitch-based graphitic foam, such as is described in U.S. Pat. No. 5,961,814 or U.S. Pat. No. 6,033,506, which are hereby incorporated herein by reference. Another graphitic foam product which is suitable for use in the present invention is available from Poco Graphite, Inc. of Decatur, Tex. under the brand name PocoFoam™. Due to their open microcellular structure and interconnected network of highly aligned graphitic ligaments, such graphitic foam products have relatively low densities yet comparatively high thermal conductivities. For example, the PocoFoam™ graphitic foam product comprises a density of less than about 0.6 g/cm$^3$ but a thermal conductivity of around 150 W/m-K. Consequently, these mesophase pitch-based graphitic foam products are comparatively lightweight but have superior heat transfer characteristics. In addition, owing to their open microcellular structure, such foam products comprise a large specific surface area. The PocoFoam™ graphitic foam product, for example, comprises a specific surface area of greater than about 4 m$^2$/g. As a result, the transfer of heat from the graphitic foam product to the cooling fluid is very efficient.

The specific surface area of the graphitic foam product 22 may be increased by activating the product using a suitable activation technique. However, since conventional activation techniques often degrade the mechanical properties of graphitic foam products, an acceptable alternative would include using a foam product which is activated prior to being graphitized. Such a graphitic foam product is described in applicants' co-pending U.S. patent application Ser. No. 10/174,838, which is hereby incorporated herein by reference.

As shown most clearly in FIG. 3, each housing includes an inlet 30 which is coupled to the conduit network 28 with a suitable fluid connector (not shown), and an outlet 32 which, in the embodiment of the invention shown in FIG. 1, is open to the environment. The housing 24 is ideally constructed of a material having a relatively high thermal conductivity, such as aluminum. In addition, the housing 24 may be affixed to the graphitic foam product 22 using a thermally conductive adhesive or a suitable brazing technique, among other means. Also, the housing optimally comprises an expansion chamber 34 located between the inlet 30 and the graphitic foam product 22. The expansion chamber 34 permits the cooling fluid to expand and thus cool somewhat prior to contacting the graphitic foam product 22.

The conduit network 28 is ideally designed to enable the housings 24 to be readily disconnected from the fluid source 26 so that either the circuit board 16 or the fluid source 26 can be conveniently removed from the server 12. Thus, the conduit 28 includes a first branch 36 which is connected to the fluid source 26 and a second branch 38 which is supported on the circuit board 16 and connected to each of the housings 24. In addition, the second branch 38 may comprise a number of side branches 40 which are each connected between the inlet 30 of a corresponding housing 24 and a suitable fitting 42 that is attached to the second branch.

The first and second branches 36, 38 are preferably releasably connected together via a conventional fluid coupling 44. The coupling 44 includes a male component 46 which is mounted, for example, on a frame member 48 of the server 12, and a female component 50 which is mounted on a header 52 that is connected to the circuit board 16. As is well known in the art, the male and female components 46, 50 each comprise a poppet-type valve which is closed when the male and female components are disconnected but opened when these components are engaged. In this manner, when the circuit board 16 is fully inserted into the server 12, the coupling 44 will automatically engage to provide a fluid-tight connection between the first branch 36 and the second branch 38. In addition, should the circuit board 16 need to be removed, the coupling 44 will disconnect the first branch 36 from the second branch 38 and retain the cooling fluid within these branches.

Figure 6:
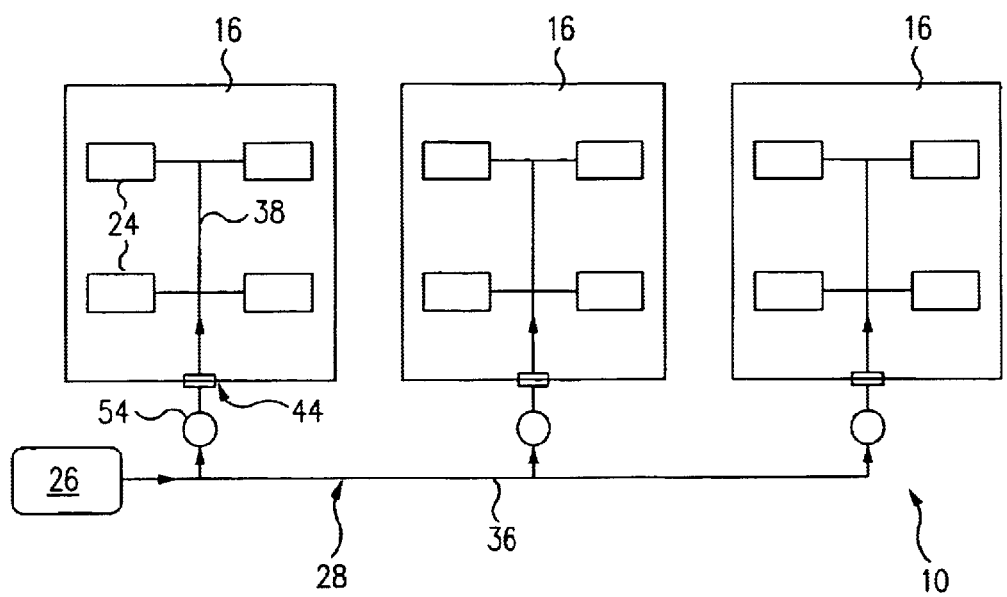
FIG. 6 is a schematic representation of the embodiment of the invention depicted in FIG. 1.

As shown in FIG. 6, the distributed graphitic foam heat exchanger 10 may be used to cool a plurality of circuit components which are mounted on separate circuit boards 16 in the server 12. Thus, the conduit network 28 includes a first branch 36 which is connected to the fluid source 26 and a number of second branches 38, each of which is supported on a corresponding circuit board 16 and connected to the housings 24 that are located on that circuit board. The first branch 36 is connected to each second branch 38 by a preferably releasable coupling 44. In addition, either the first branch 36 or each second branch 38 may include one or more conventional flow arrestors 54 for stopping the flow of cooling fluid should a leak develop in that branch.

The fluid source 26 produces a flow of cooling fluid which is communicated through the conduit network 28 to each housing 24 to cool the graphitic foam product 22, which in effect acts as a heat sink to draw heat away from the circuit component 14. In the embodiment of the invention illustrated in FIG. 1, the cooling fluid is air and the fluid source 26 is preferably a blower or compressor. The fluid source 26 ideally generates the air at a pressure which is sufficient to overcome the pressure drop associated with the graphitic foam products 22, which depends on the length and porosity of the products. For example, the fluid source may be required to generate air at a pressure of between about 10 kPa and 100 kPa in order to overcome the pressure drop. The fluid source 26 may be mounted to a frame member 56 of the server 12. Moreover, the fluid source 26 may be positioned either within or outside of the housing 20.

In an alternative embodiment which is not illustrated in the drawings, the fluid source 26 may be mounted on a base which is slidably supported on rails that are connected to the frame 20 of the server 12, similar to the manner in which the circuit board 16 is slidably supported on the rails 18. In addition, the conduit network 28 of this embodiment includes a first branch which is connected to the fluid source 26, a second branch which is connected to each of the housings 24 and a third branch which is fixed relative to the frame 20 of the server 12. Furthermore, the first branch is preferably releasably connected to the third branch with a first fluid coupling and the second branch is preferably releasably connected to the third branch with a second fluid coupling. In this manner, the fluid source 26 may be easily removed from the server 12.

Furthermore, although the invention has been described as comprising a single fluid source 26, the distributed graphitic foam heat exchanger system 10 could comprise a number of such fluid sources. For example, a fluid source 26 could be mounted on each circuit board 16 to provide cooling fluid to the housings 24 which are mounted on that circuit board. This would eliminate the need to provide fluid couplings between the frame 20 of the server and each circuit board 16.

In operation of the graphitic foam heat exchanger system 10 depicted in FIG. 1, the fluid source 26 is activated to pump a cooling fluid through the conduit network 28 to the housings 24. The fluid source may be activated either manually via a conventional switch or automatically by a controller which receives input from a temperature sensor that is thermally coupled to the server 12 or a circuit component 14. As the cooling fluid enters the inlet 30 of each housing 24, it will expand and engage the full cross sectional area of the graphitic foam product 22. Due to its thermal transfer characteristics, the graphitic foam product 22 will conduct heat away from the circuit component 14 and into its interconnected network of aligned graphitic ligaments. As the cooling fluid passes through the open microcellular pores of the graphitic foam product, the heat from the graphitic ligaments will be transferred to the cooling fluid. The cooling fluid then exits the housing 24 through the outlet 32 and thereby rejects this heat into the environment. Since in the embodiment of the invention depicted in FIG. 1 the outlet 32 is open to the environment, the preferred cooling fluid for this embodiment is air.

Figure 4:
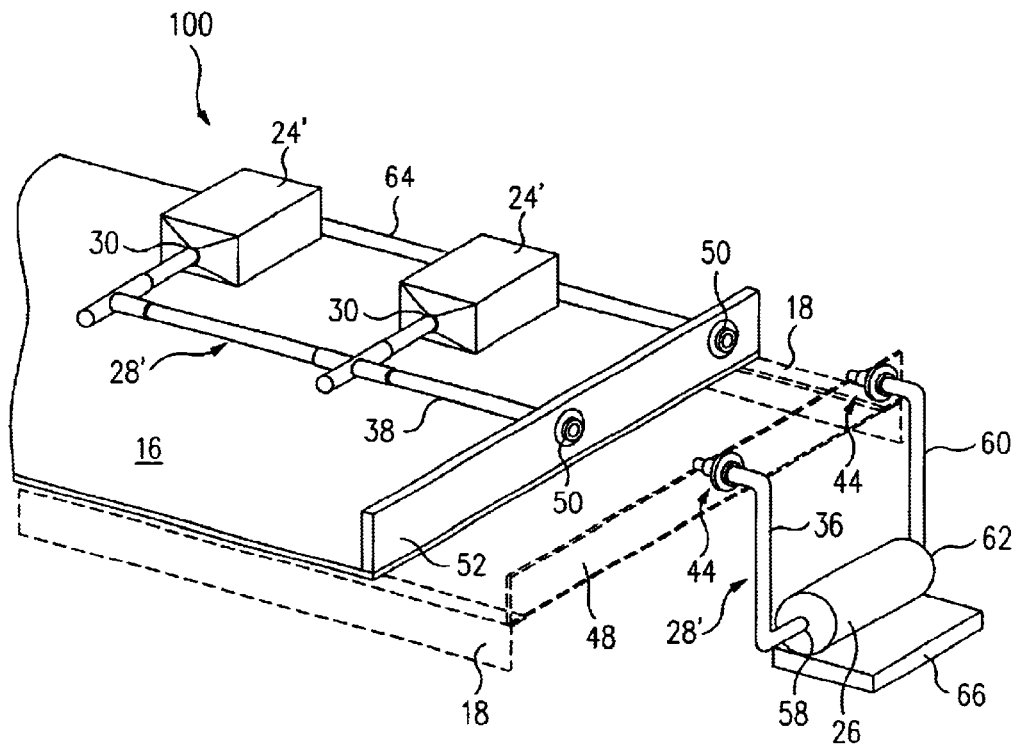
FIG. 4 is another embodiment of the graphitic foam heat exchanger system of the present invention.
Figure 5:
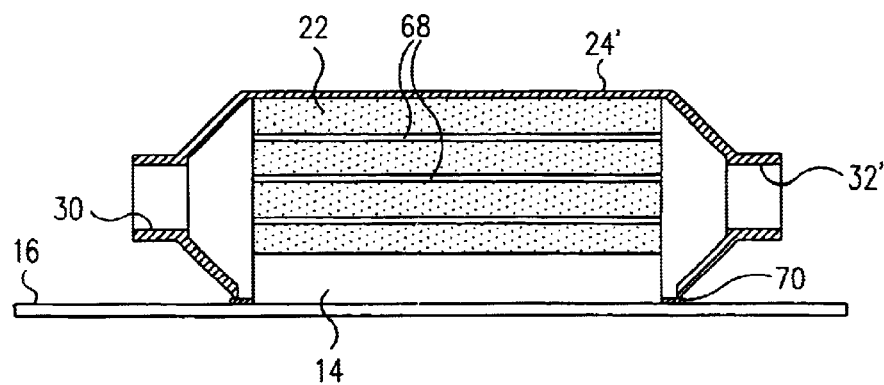
FIG. 5 is a cross sectional view of a portion of the invention depicted in FIG. 4.

Referring now to FIGS. 4 and 5, another embodiment of the distributed graphitic foam heat exchanger system, which is indicated generally by reference number 100, is shown to comprise many of the same components as the distributed graphitic foam heat exchanger system 10 that was just described. Thus, the distributed graphitic foam heat exchanger system 100 includes a plurality of graphitic foam products 22 which are each attached to a corresponding circuit component 14, a plurality of housings 24' which are each mounted over a corresponding graphitic foam product, a fluid source 26, and a conduit network 28' for fluidly connecting the fluid source with each housing.

In this embodiment, however, each housing 24' ideally comprises an inlet 30 and a similarly configured outlet 32'. In addition, each housing is preferably sealed to the circuit component 14 or the circuit board 16 with a suitable elastomer sealing member 70. The sealing member 70 serves to ensure that fluid entering the inlet 30 and exiting the outlet 32' does not leak from the housing 24'.

Furthermore, in this embodiment the conduit network 28' forms a closed cooling loop between the fluid source 26 and the housings 24'. Thus, the conduit network 28' includes a first branch 36 which is connected to an outlet 58 of the fluid source 26, a second branch 38 which is connected to the inlet 30 of each housing 24', a third branch 60 which is connected to an inlet 62 of the fluid source, and a fourth branch 64 which is connected to the outlet 32' of each housing. In addition, the first and third branches 36, 60 are preferably releasably coupled to the second and fourth branches 38, 64, respectively, with corresponding fluid couplings 44.

The distributed graphitic foam heat exchanger system 100 is particularly suitable for use when air, water or any other conventional heat exchange fluid is employed as the cooling fluid. In operation, the cooling fluid is pumped through the first and second branches 36, 38 and into each housing 24'. As the cooling fluid passes through the graphitic foam products 22, it will absorb the heat generated by the circuit components 14. The cooling fluid will then exit the housings 24' and be communicated back to the fluid source 26 through the fourth and third branches 64, 60 of the conduit network 28'. Thus, the cooling fluid circulates between the fluid source 26 and the housings 24' in a closed loop formed by the conduit network 28'. If required, a conventional heat exchanger 66 may be thermally coupled to the fluid source 26 to remove the heat from the cooling fluid. In addition, each graphitic foam product may include a number of through bores 68 to facilitate the passage of the cooling fluid through the foam product.

Figure 7:
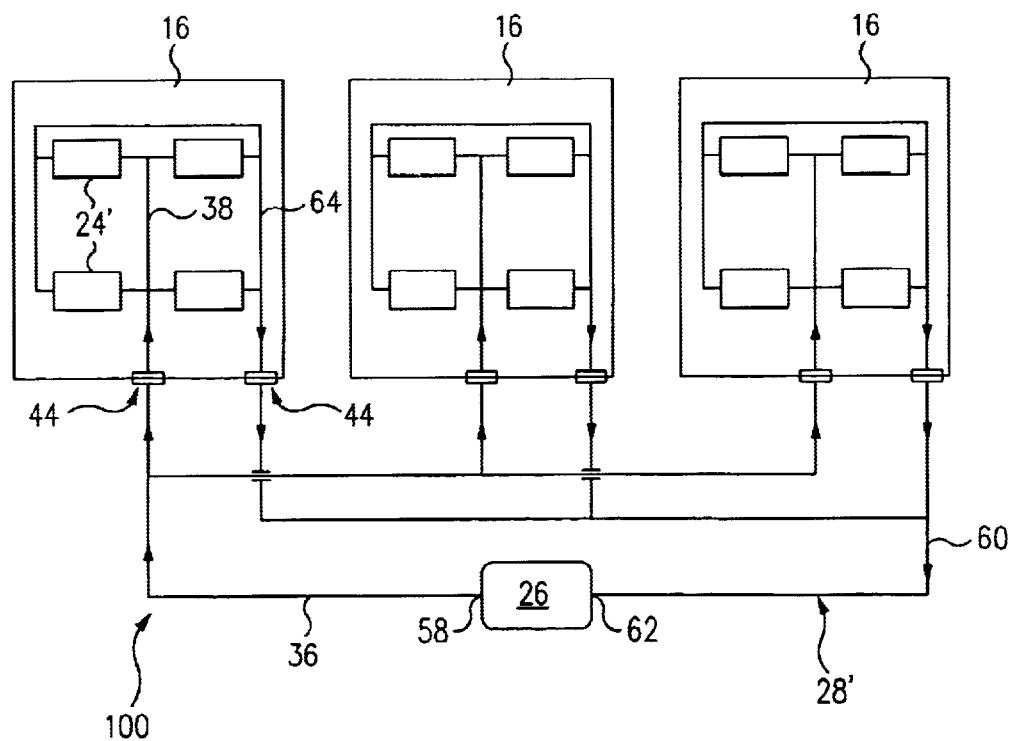
FIG. 7 is a schematic representation of the embodiment of the invention depicted in FIG. 4.

As shown in FIG. 7, the distributed graphitic foam heat exchanger system 100 may be used to cool a plurality of circuit components which are mounted on separate circuit boards 16 in the server 12. Thus, the conduit network 28' includes a first branch 36 which is connected to the outlet 58 of the fluid source 26 and a number of second branches 38 which are each supported on a corresponding circuit board 16 and connected to the inlets 30 of the housings 24' that are located on that circuit board. In addition, the conduit network 28' includes a third branch 60 which is connected to the inlet 62 of the fluid source 26 and a number of fourth branches 64 which are each supported on a corresponding circuit board 16 and connected to the outlets 32' of the housings 24' that are located on that circuit board. Furthermore, the first and third branches 36, 60 are connected to each second and fourth branch 38, 64, respectively, by a preferably releasable coupling 44. Also, any of the branches thus described may include one or more conventional flow arrestors (not shown) for stopping the flow of cooling fluid should a leak develop in that branch.

As with the graphitic foam heat exchanger system 10 described above, the fluid source 26 of the graphitic foam heat exchanger system 100 may be mounted on a base which is slidably supported on rails that are connected to the frame 20 of the server 12. In addition, the distributed graphitic foam heat exchanger system 100 could comprise a number of fluid sources 26, each of which is mounted on a corresponding circuit board 16 to provide cooling fluid to the housings 24' which are mounted on that circuit board.

In an alternative to the graphitic foam heat exchanger system 100, the outlet 32' of each housing 24' is connected to a conduit which communicates with the exterior of the housing 20. For example, the system of this embodiment could comprise a conduit network similar to the conduit network 28' shown in FIG. 7, with the exception of the third branch 60. Instead, the cooling fluid which exits each housing 24' would be communicated to the fourth branch 64 and then to the exterior of the housing 20 through, for example, the coupling 44. In this manner, the heated cooling fluid from the housings 24' is vented into the environment outside of the housing 20. In this embodiment the preferred cooling fluid is air.

It should be recognized that, while the present invention has been described in relation to the preferred embodiments thereof, those skilled in the art may develop a wide variation of structural and operational details without departing from the principles of the invention. For example, the various elements shown in the different embodiments may be combined in a manner not illustrated above. Therefore, the appended claims are to be construed to cover all equivalents falling within the true scope and spirit of the invention.

What is claimed is:

1. A system for cooling at least two electronic components comprising:
    a plurality of graphitic foam products, of which is thermally coupled to a corresponding component;
    a plurality of housings, each of which is mounted over a corresponding foam product and comprises an inlet and an outlet;
    a source of cooling fluid; and
    a conduit which is connected between the fluid source and each inlet, wherein;
        fluid is communicated from the fluid source to each housing through the conduit to thereby cool the components, further wherein:
            at least one first component is mounted on a first base which is movably supported on a frame;
            the fluid source is mounted on the frame;
            the conduit comprises a first portion which is connected to the fluid source and fixed relative to the frame and a second portion which is connected to the housing of the first component and fixed relative to the first base; and
            the system further comprises first means for connecting the first portion to the second portion.

2. The system of claim 1, wherein:
    at least one second component is mounted on a second base which is movably supported on the frame;
    the conduit comprises a third portion which is connected to the housing of the second component and fixed relative to the second base; and
    the system further comprises second means for connecting the first portion to the third portion.

3. The system of claim 2, wherein the first and second connecting means each comprise a disconnectable fluid coupling.

4. A system for cooling at least two electronic components comprising:
    a plurality of graphitic foam products, each of which is thermally coupled to a corresponding component;
    a plurality of housings, each of which is mounted over a corresponding foam product and comprises an inlet and an outlet;
    a source of cooling fluid; and
    a conduit which is connected between the fluid source and each inlet, wherein;
        fluid is communicated from the fluid source to each housing through the conduit to thereby cool the components, further wherein:
            at least one first component is mounted on a first base which is movably supported on a frame;
            the fluid source is mounted on a second base which is movably supported on the frame;
            the conduit comprises a first portion which is fixed relative to the frame, a second portion which is connected to the housing of the first component and fixed relative to the first base, and a third portion which is connected to the fluid source and fixed relative to the second base; and
            the system further comprises first means for connecting the first portion to the second portion and second means for connecting the first portion to the third portion.

5. The system of claim 4, wherein:
    at least one second component is mounted on a third base which is movably supported on the frame;
    the conduit comprises a fourth portion which is connected to the housing of the second component and fixed relative to the third base; and
    the system further comprises third means for connecting the first portion to the fourth portion.

6. The system of claim 5, wherein the first, second and third connecting means each comprise a disconnectable fluid coupling.

7. A system for cooling at least two electronic components comprising:
    a plurality graphitic foam products, of which is thermally coupled to a corresponding component;
    a plurality of housings, each of which is mounted over a corresponding foam product and comprises an inlet and an outlet;
    a source of cooling fluid; and
    a conduit which is connected between the fluid source and each inlet, wherein;
        fluid is communicated from the fluid source to each housing through the conduit to thereby cool the components, further wherein:
            at least one first component is mounted on a first base which is movably supported on a frame;
            the fluid source is mounted on the frame;
            the conduit comprises a first portion which is connected to an outlet of the fluid source and is fixed relative to the frame; a second portion which is connected to an inlet of the fluid source and is fixed relative to the frame, a third portion which is connected to an inlet of the housing for the first component and is fixed relative to the first base, and a fourth portion which is connected to an outlet of the housing for the first component and is fixed relative to the first base; and
            the system further comprises first means for connecting the first portion to the third portion and second means for connecting the second portion to the fourth portion.

8. The system of claim 7, wherein:
    at least one second component is mounted on a second base which is movably supported on the frame;
    the conduit comprises a fifth portion which is connected to an inlet of the housing for the second component and is fixed relative to the second base, and a sixth portion which is connected to an outlet for the housing for the second component and is fixed relative to the second base; and
    the system further comprises third means for connecting the first portion to the fifth portion and fourth means for connecting the second portion to the sixth portion.

9. The system of claim 8, wherein the first through fourth connecting means each comprise a disconnectable fluid coupling.

10. A system for cooling at least two electronic components comprising:
a plurality of graphitic foam products, each of which is thermally coupled to a corresponding component;
a plurality of housings, each of which is mounted over a corresponding foam product and comprises an inlet and an outlet;
a source of cooling fluid; and
a conduit which is connected between the fluid source and each inlet, wherein;
fluid is communicated from the fluid source to each housing through the conduit to thereby cool the components, further wherein:
at least one first component is mounted on a first base which is movably supported on a frame;
the fluid source is mounted on a second base which is movably supported on the frame;
the conduit comprises a first portion which is fixed relative to the frame, a second portion which is fixed relative to the frame, a third portion which is connected to an inlet of the housing for the first component and is fixed relative to the first base, a fourth portion which is connected to an outlet of the housing for the first component and is fixed relative to the first base, a fifth portion which is connected to an outlet of the fluid source and is fixed relative to the second base; and a sixth portion which is connected to an inlet of the fluid source and is fixed relative to the second base; and
the system further comprises first means for connecting the first portion to the third portion, second means for connecting the first portion to the fifth portion, third means for connecting the second portion to the fourth portion and fourth means for connecting the second portion to the sixth portion.

11. The system of claim 10, wherein:
at least one second component is mounted on a third base which is movably supported on the frame;
the conduit comprises a seventh portion which is connected to an inlet of the housing for the second component and is fixed relative to the third base, and an eighth portion which is connected to an outlet of the housing for the second component and is fixed relative to the third base; and
the system further comprises fifth means for connecting the first portion to the seventh portion and sixth means for connecting the second portion to the eighth portion.

12. The system of claim 11, wherein the first through sixth connecting means each comprise a disconnectable fluid coupling.

13. A cooling system for a device which includes a frame, a first base which is movably supported on the frame, and a plurality of electronic components, the cooling system comprising:
a plurality of graphitic foam products, each of which is thermally coupled to a corresponding component;
a plurality of housings, each of which is mounted over a corresponding foam product and comprises an inlet and an outlet;
a source of cooling fluid;
a conduit which is connected between the fluid source and each inlet;
wherein fluid is communicated from the fluid source to each housing through the conduit to thereby cool the components.

14. The system of claim 13, wherein:
at least one first component is mounted on the first base;
the fluid source is supported on the frame;
the conduit comprises a first portion which is connected to the fluid source and fixed relative to the frame and a second portion which is connected to the housing of the first component and fixed relative to the first base; and
the system further comprises first means for connecting the first portion to the second portion.

15. The system of claim 14, wherein:
at least one second component is mounted on a second base which is movably supported on the frame;
the conduit comprises a third portion which is connected to the housing of the second component and fixed relative to the second base; and
the system further comprises second means for connecting the first portion to the third portion.

16. The system of claim 15, wherein the first and second connecting means each comprise a disconnectable fluid coupling.

17. The system of claim 13, wherein:
at least one first component is mounted on the first base;
the fluid source is mounted on a second base which is movably supported on the frame;
the conduit comprises a first portion which is fixed relative to the frame, a second portion which is connected to the housing of the first component and fixed relative to the first base, and a third portion which is connected to the fluid source and fixed relative to the second base; and
the system further comprises first means for connecting the first portion to the second portion and second means for connecting the first portion to the third portion.

18. The system of claim 17, wherein:
at least one second component is mounted on a third base which is movably supported on the frame;
the conduit comprises a fourth portion which is connected to the housing of the second component and fixed relative to the third base; and
the system further comprises third means for connecting the first portion to the fourth portion.

19. The system of claim 18, wherein the first, second and third connecting means each comprise a disconnectable fluid coupling.

20. The system of claim 13, wherein:
at least one first component is mounted on the first base;
the fluid source is mounted on a second base which is movably supported on the frame;
the conduit comprises a first portion which is fixed relative to the frame, a second portion which is relative to the frame, a third portion which is connected to an inlet of the housing for the first component and is fixed relative to the first base, a fourth portion which is connected to an outlet of the housing for the first component and is fixed relative to the first base, a fifth portion which is connected to an outlet of the fluid source and is fixed relative to the second base; and a sixth portion which is connected to an inlet of the fluid source and is fixed relative to the second base; and
the system further comprises first means for connecting the first portion to the third portion, second means for connecting the first portion to the fifth portion, third means for connecting the second portion to the fourth portion and fourth means for connecting the second portion to the sixth portion.

21. The system of claim 20, wherein:

at least one second component is mounted on a third base which is movably supported on the frame;

the conduit comprises a seventh portion which is connected to an inlet of the housing for the second component and is fixed relative to the third base, and an eighth portion which is connected to an outlet of the housing for the second component and is fixed relative to the third base; and the system further comprises fifth means for connecting the first portion to the seventh portion and sixth means for connecting the second portion to the eighth portion.

22. The system of claim 21, wherein the first through sixth connecting means each comprise a disconnectable fluid coupling.

* * * * *